US006834244B2

(12) United States Patent
Kim

(10) Patent No.: US 6,834,244 B2
(45) Date of Patent: Dec. 21, 2004

(54) RESOLVER PHASE CALIBRATION SYSTEM AND METHOD

(75) Inventor: Sang-Hwan Kim, Yeoju-gun (KR)

(73) Assignee: Hyundai Motor Company, Seoul (KR)

( * ) Notice: Subject to any disclaimer, the term of this patent is extended or adjusted under 35 U.S.C. 154(b) by 57 days.

(21) Appl. No.: 10/331,243

(22) Filed: Dec. 30, 2002

(65) Prior Publication Data

US 2004/0019446 A1 Jan. 29, 2004

(30) Foreign Application Priority Data

Jul. 23, 2002 (KR) .............................. 10-2002-0043234

(51) Int. Cl.[7] .............................................. G06F 19/00
(52) U.S. Cl. ...................... 702/72; 324/76.77; 318/605
(58) Field of Search ................................ 318/603, 605; 702/117, 124, 72, 106; 324/601, 772, 76.16, 76.77; 341/115

(56) References Cited

U.S. PATENT DOCUMENTS 4,109,185 A * 8/1978 Froyd et al. ............... 318/571
4,712,106 A * 12/1987 McNally ................. 340/870.32
5,451,945 A * 9/1995 Alhorn et al. .............. 341/110
6,373,219 B1 * 4/2002 Obara et al. ................ 318/801

* cited by examiner

*Primary Examiner*—Marc S. Hoff
*Assistant Examiner*—Paul L Kim
(74) *Attorney, Agent, or Firm*—Morgan Lewis & Bockius LLP

(57) ABSTRACT

A resolver phase calibration system comprises a reference pulse generation unit, a resolver-to-digital converter (RDC), and a calibration phase calculating unit. The reference pulse generation unit is configured to generate a reference pulse signal based on a back electro-motive voltage signal of a motor. The RDC is configured to convert output signals of a resolver to a pulse signal, to count pulses of the converted pulse signal, and to output a digital output signal corresponding to a number of the pulses. The calibration phase calculating unit is configured to calculate a calibration phase of the resolver based on the reference pulse signal from the reference pulse generation unit and the digital output signal from the RDC.

4 Claims, 4 Drawing Sheets

RESOLVER PHASE CALIBRATION SYSTEM AND METHOD

FIELD OF THE INVENTION

The present invention relates to a position detection apparatus for a motor, and more particularly, to a resolver phase calibration system and method for automatically calibrating an offset of a resolver in order to increase the precision of torque control and speed control of the motor.

BACKGROUND OF THE INVENTION

Generally, a motor control unit (MCU) determines a coordinate system based on flux position to perform vector control of a synchronous motor or an induction motor, which may be used in an electric vehicle or in a hybrid electric vehicle. To make this determination, a resolver, which detects an absolute position of a rotor of the motor, is used.

The resolver is a type of a transformer, whereby if a shaft rotates while a voltage is applied to a primary coil (input side), the magnetic coupling coefficient changes, causing an output voltage having changed amplitudes for each carrier to be generated in a secondary coil (output side). The coils are arranged so that the output voltage will be changed to a sine wave and a cosine wave in response to a rotational speed of the shaft. Therefore, the rotating angle of the resolver can be determined by the ratio of amplitudes of the sine wave and the cosine wave.

The resolver is configured to detect a speed and a phase of the motor, and to provide corresponding position information to the MCU. The MCU uses the position information for torque and speed control of the motor. For these reasons, it is important to mount the resolver at a precise position. However, it is possible that error may occur during mounting of the resolver, as it is quite difficult to mount the resolver in a power train system. This error may make it impossible to detect a precise position and speed of the rotor of the motor, making it difficult to control the motor for optimal operation.

An example of a prior-art method to calibrate a sensing error of a resolver is a method that analyzes back electro-motive voltage signals between lines of the motor and waveforms of signals of the resolver, using measuring devices such as an oscilloscope, and then calibrates the errors. However, this method for calibrating sensing errors of a revolver is a manual process, requiring large amounts of time and effort. Furthermore, precise calibration cannot be guaranteed, so operation of the motor in an optimal operating range also cannot be guaranteed.

The information disclosed in this Background of the Invention section is only for enhancement of understanding of the background of the invention, and should not be taken as an acknowledgement or any form of suggestion that this information forms prior art that is already known to a person skilled in the art.

SUMMARY OF THE INVENTION

In a preferred embodiment of the present invention, a resolver phase calibration system comprises a reference pulse generation unit, a resolver-to-digital converter (RDC), and a calibration phase calculating unit. The reference pulse generation unit is configured to generate a reference pulse signal based on a back electro-motive voltage signal of a motor. The RDC is configured to convert output signals of a resolver to a pulse signal, to count pulses of the converted pulse signal, and to output a digital output signal corresponding to the number of the pulses. The calibration phase calculating unit is configured to calculate a calibration phase of the resolver based on the reference pulse signal from the reference pulse generation unit and the digital output signal from the RDC.

It is preferable that the RDC comprises a first calculating member, a second calculating member, a third calculating member, a synchronization rectification unit, a voltage controlled oscillator, and a counter. The first calculating member is configured to multiply a sine wave signal output from the resolver by a cosine value of current position detection data. The second calculating member is configured to multiply a cosine wave signal output from the resolver by a sine value of the current position detection data. The third calculating member is configured to subtract an output signal of the second calculating member from an output signal of the first calculating member.

The synchronization rectification unit is configured to rectify an output signal of the third calculating member. The voltage controlled oscillator is configured to receive an output of the synchronization rectification unit, and to generate pulses having a frequency. Finally, the counter is configured to count the pulses generated by the voltage controlled oscillator and to generate the corresponding digital output signal.

Preferably, the reference pulse generation unit includes a comparator that compares the back electro-motive voltage signal with a reference voltage, and generates the reference pulse signal.

In another preferred embodiment of the present invention, the resolver phase calibration method comprises: generating a reference pulse signal based on a back electro-motive voltage signal of a motor; generating a digital output signal indicative of phase information of a resolver based on output signals of the resolver; calculating a resolver phase calibration value based at least in part on the reference pulse signal and the digital output signal; and calibrating a phase offset of the resolver based on the phase calibration value.

Preferably, the step of generating a digital output signal further comprises: multiplying a sine wave signal output from the resolver by a cosine value of current position detection data to generate a first product; multiplying a cosine wave signal output from the resolver by a sine value of the current position detection data to generate a second product; subtracting the second product from the first product to generate a resultant output signal; rectifying the resultant output signal to generate a rectified output signal; generating pulses having a frequency related at least in part to the rectified output signal; and counting the generated pulses and generating the corresponding digital output signal.

In yet another preferred embodiment of the present invention, a resolver phase calibration system comprises a reference pulse generation unit, a resolver-to-digital converter (RDC), and a calibration phase calculating unit. The reference pulse generation unit generates a reference pulse. The RDC converts output signals of a resolver to a digital output value representing a phase difference related to the resolver position. The calibration phase calculating unit calculates a calibration phase of the resolver based at least in part on the reference pulse signal from the reference pulse generation unit and the digital output signal from the RDC.

BRIEF DESCRIPTION OF THE DRAWINGS

The accompanying drawings, which are incorporated in and constitute a part of the specification, illustrate an embodiment of the invention, and, together with the description, serve to explain the principles of the invention, where.

DETAILED DESCRIPTION OF THE PREFERRED EMBODIMENTS

Figure 1:
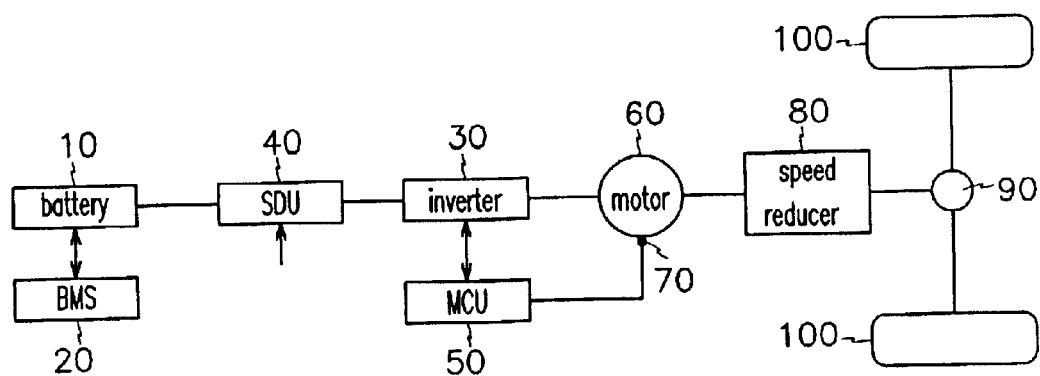
FIG. 1 is a block diagram of a power system of an electric vehicle that includes the resolver phase calibration system according to a preferred embodiment of the present invention.

Hereinafter, a preferred embodiment of the present invention will be described in detail with reference to the accompanying drawings. As shown in FIG. 1, an electric vehicle power system includes a battery 10, a battery management system (BMS) 20, an inverter 30, a safety disconnect unit (SDU) 40, a motor control unit (MCU) 50, a motor 60, a resolver 70, a speed reducer 80, a differential unit 90, and a set of wheels 100.

The battery 10 stores electric energy, and provides the energy to the motor 60. The BMS 20 is a passive lower-level controller, and it monitors temperature, state of charge (SOC), and voltage and current of the battery 10. The BMS 20 provides management information, such as current/voltage restriction information and charge/discharge control information, to an upper control unit (not shown), in order to prevent the battery 10 from being damaged. The BMS may include a processor, a memory and other necessary hardware and software components as will be understood by persons skilled in the art, to permit the BMS to communicate with sensors and execute the control functions as described herein.

The inverter 30 converts direct current provided from the battery 10 to three-phase alternating current, and provides the converted current to the motor 60. The SDU 40, which is a safety device, prevents electric power of the battery 10 from being transferred to a load, and prevents regeneration energy from being transferred to the battery 10, by disconnecting a connecting point (not shown) according to a signal input from an upper control unit (also not shown).

The MCU 50 performs motor torque control, motor speed control, regeneration control, and the like, through pulse width modulation switching control of the inverter 30. The motor 60 is driven by three-phase electric power supplied from the battery 10, and it generates traction force. The resolver 70 detects motor speed and rotor angle (position information), and provides a corresponding phase signal to the MCU 50 as feedback information. The speed reducer 80 reduces output rpm of the motor 50 to a predetermined level. The differential unit 90 transfers traction force of the motor 60 provided from the speed reducer 80 to the wheels 100.

Figure 2:
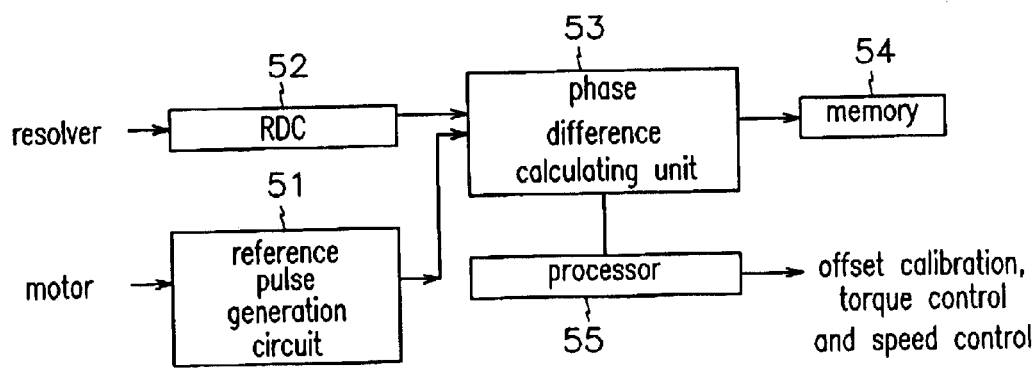
FIG. 2 is a block diagram of a motor control unit (MCU), in accordance with a preferred embodiment of the present invention.

As shown in FIG. 2, in a preferred embodiment, the MCU 50 includes a reference pulse generation circuit 51, a resolver-to-digital converter (RDC) 52, a phase difference calculating unit 53, a memory 54, and a processor 55.

Referring back to FIG. 1, the reference phase pulse generation circuit 51 generates a square-wave pulse signal using a back electro-motive voltage signal through a zero-crossing method, where the point of crossing a reference voltage of 0V is identified as a reference point. The RDC 52, described in further detail below, receives output signals of the resolver 70, generates a pulse signal using the signals of the resolver, and counts pulses of the pulse signal, to generate a digital output signal. The digital output signal indicates the number of counted pulses, and the torque and speed control is performed based on the digital output signal.

The phase difference calculating unit 53 calculates a phase difference by comparing the reference pulse signal input from the reference phase generation unit 51 with the digital output signal from the RDC 52. The memory 54 saves an offset value in response to the phase difference. Finally, the processor 55 generates a torque control signal and a speed control signal for the motor 60 by calibrating the offset of the phase in consideration of the calculated phase difference.

Figure 3:
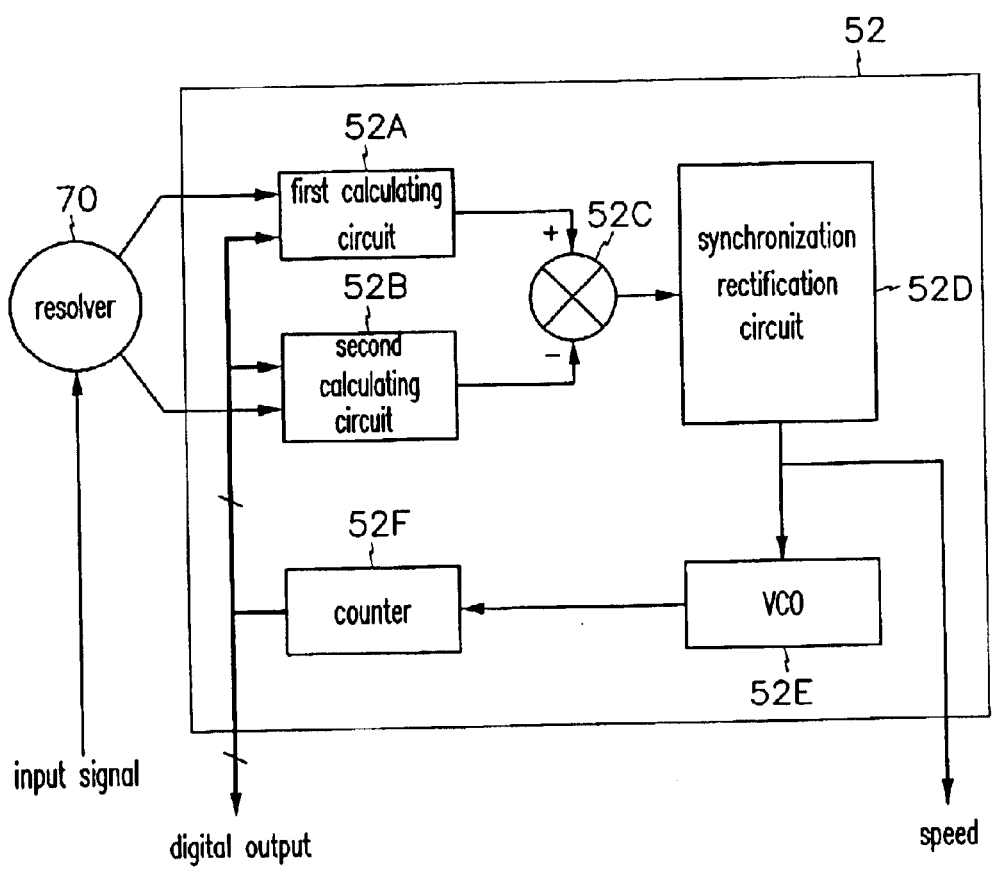
FIG. 3 is a block diagram of a resolver/digital converter of the resolver phase calibration system, in accordance with another preferred embodiment of the present invention.

Referring to FIG. 3, additional detail is shown on the resolver-to-digital converter (RDC) 52, which includes a first calculating circuit 52A, a second calculating circuit 52B, a third calculating circuit 52C, a synchronization rectification circuit 52D, a voltage controlled oscillator (VCO) 52E, and a counter 52F.

The first calculating circuit 52A multiplies a sine output signal (provided by the resolver 70) by $\cos \phi$, where $\phi$ is position detection data provided by the counter 52F, as will be explained below. The second calculating circuit 52B multiplies a cosine output signal (also provided by the resolver 70) by $\sin \phi$. The third calculating circuit 52C subtracts the output of the second calculating circuit 52B from the output of the first calculating circuit 52A.

The synchronization rectification circuit 52D rectifies the output of the third calculating circuit 52C with a reference signal, such as, e.g., a sine wave with a predetermined frequency. The VCO 52E oscillates (i.e., generates) a pulse having a frequency proportional to a difference between current position data and the position detection data $\phi$, and sends it to the counter 52F. The counter 52F counts the number of pulses, and generates and outputs the digital output signal described above.

Figure 4:
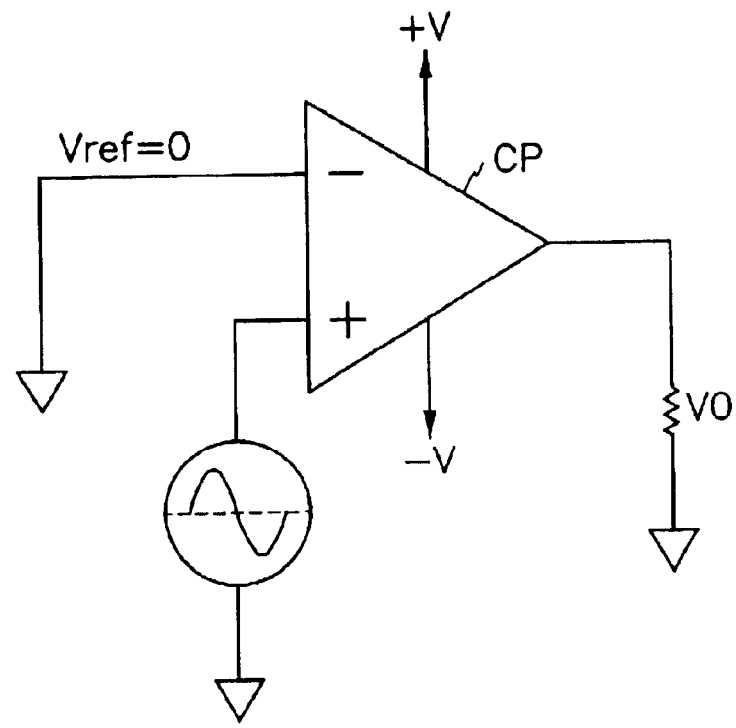
FIG. 4 is a block diagram of a reference pulse generation circuit of the resolver phase calibration unit according to one preferred embodiment of the present invention.

As shown in FIG. 4, the reference pulse generation circuit 51 can be implemented as a comparator (CP). The reference voltage Vref (0V) is applied to a negative input of the CP, and the back electro-motive voltage signal output from the motor 60 is applied to a positive input of the CP. The CP generates a square-wave pulse through a zero-crossing method.

The operation of the resolver phase calibration system, according to a preferred embodiment of the present invention, will be described next.

Referring back to FIG. 1, the inverter 30 converts a direct current power supplied from the battery 10 to three-phase alternating current power in response to pulse width modulation control of the MCU 50, and provides the three-phase alternating current power to the motor 60.

If the motor 60 is driven, an input voltage is applied to a primary (input) coil of the resolver 70. Then, output voltage signals are generated in a secondary (output) coil of the resolver 70 while a shaft of the resolver 70 rotates in response to the operation of the motor 60. The phases and amplitudes of the output voltage are different from those of the input voltage. The resolver 70 outputs a sine wave signal and a cosine wave signal, and they are supplied to the RDC 52. For example, if a voltage signal sin ωt is input to the resolver 70, the resolver 70 outputs two voltage signals, kE sin ωt·sin θ and kE sin ωt·cos θ, and sends them to the RDC 52.

Next, referring back to FIG. 3, the first calculating circuit 52A of the RDC 52 multiplies the input kE sin ωt·sin θ by cos ω, and outputs the result—kE sin ωt ·sin θ cos φ—to the third calculating circuit 52C. The second calculating circuit 52B multiplies the input kE sin ωt·cos θ by sin φ, and also outputs the result—kE sin ωt·cos θ sin φ—to the third calculating circuit 52C. The third calculating circuit 52C subtracts the input from the second calculating circuit 52B from the input from the first calculating circuit 52A, and outputs a signal to the synchronization rectification circuit 52D, according to the following equation:

$$kE \sin t(\sin \theta \cos \phi - \cos \theta \sin \phi) = kE \sin \omega t \sin(\theta - \phi)$$

where θ is the current position (angle) of a rotator, φ is the position detection data, and θ−φ is a value that is proportional to a speed.

The synchronization rectification circuit 52D then rectifies this signal, and the VCO 52E generates pulses having a frequency in proportion to the phase difference θ−φ. The counter 52F counts the pulses, and generates a corresponding digital output. The counter also outputs the value of the position detection data φ to the first and second calculating circuits 52A and 52B, and as an external signal to the RDC 52 (shown as part of the "digital output" signal).

Figure 5:
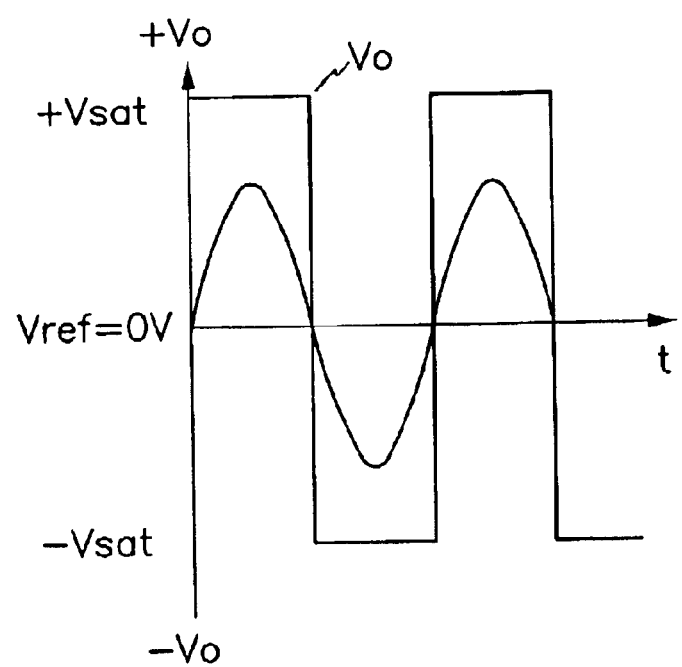
FIG. 5 shows the reference pulse signal generated from a back electro-motive voltage signal of a motor.

Referring to FIG. 5, the reference pulse generation circuit 51 generates and outputs a reference pulse signal (the square wave shown), using the back electro-motive voltage signal input from the motor 60. The phase difference calculating unit 53 then calculates a calibration phase based on the reference pulse signal input from the reference pulse generation circuit 51, and the digital output value input from the RDC 52. In other words, the phase difference calculating unit 53 calculates the calibration value of the phase of the resolver 70 based on the digital output value at the reference point of the reference pulse.

If the resolver 70 is mounted at a precise position, the digital output value should be zero at the reference point where the back electro-motive voltage starts to be applied. Therefore, if the digital output value is not zero at the reference point, there is a phase error corresponding to the digital output value of the RDC 52. (Recall that the digital output value indicates the number of counted pulses.)

For example, in case of a 10-bit counter, a resolution of one pulse is $360°/2^{10}$, and the phase calibration value can be acquired by the following equation:

$$\text{calibration\_phase}(°) = 360° \times \frac{\text{Pulse\_cal}}{2^{10}}$$

where Pulse__cal is the number of pulses of the pulse signal generated by the VCO 52E at a point corresponding to the reference point of the reference pulse. The digital output value represents this number of pulses.

Thus, when the phase difference calculating unit 53 calculates the phase calibration value using the same or a similar equation, the processor 55 inside the MCU 50 automatically calibrates the phase difference of the resolver 70 according to this phase calibration value. In this manner, the MCU can more precisely control torque and speed of the motor 60.

Figure 6:
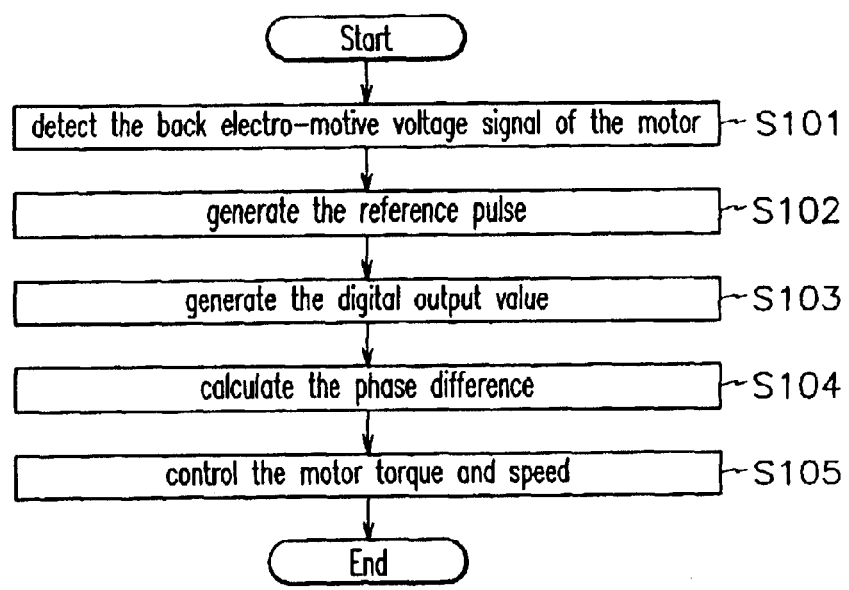
FIG. 6 is a flowchart of a resolver phase calibration method according to a preferred embodiment of the present invention.

Referring to FIG. 6, a resolver-phase calibration method is shown, according to a preferred embodiment of the present invention. The reference pulse generation circuit 51 first detects the back electro-motive voltage signal of the motor 60 (S101), and then generates the reference square-wave pulse through the zero-crossing method (S102). Next, the RDC 52 generates the pulse signal using the output signal of the resolver 70, counts the generated pulses, and generates the digital output value in response to the number of the counted pulses (S103).

Then, the phase difference calculating unit 53 calculates the phase difference based on the reference pulse signal input from the reference pulse generation circuit 51 and the digital output value input from the RDC 52 (S104). Finally, the processor 55 controls the torque and speed of the motor based on the calculated phase difference and the digital output value (S105).

As stated above, the system according to a preferred embodiment of the present invention may automatically calibrate the phase difference of the resolver, which detects a rotational position of the motor in an electric vehicle. Accordingly, it is easier to mount the resolver, and control of the motor using the resolver is improved.

Although preferred embodiments of the present invention have been described in detail hereinabove, it should be clearly understood that many variations and/or modifications of the basic inventive concepts herein taught which may appear to those skilled in the present art will still fall within the spirit and scope of the present invention, as defined in the appended claims. Throughout this specification and the claims which follow, unless explicitly described to the contrary, the word "comprise" or variations such as "comprises" or "comprising" will be understood to imply the inclusion of stated elements but not the exclusion of any other elements.

What is claimed is:

1. A resolver phase calibration system, comprising:

a reference pulse generation unit configured to generate a reference pulse signal based on a back electro-motive voltage signal of a motor;

a resolver-to-digital converter (RDC) configured to convert output signals of a resolver to a pulse signal, to count pulses of said converted pulse signal, and to output a digital output signal corresponding to a number of said pulses wherein said RDC comprises a first calculating member configured to multiply a sine wave signal output from said resolver by a cosine value of current position detection data;

a second calculating member configured to multiply a cosine wave signal output from said resolver by a sine value of said current position detection data;

a third calculating member configured to subtract an output signal of said second calculating member from an output signal of said first calculating member;

a synchronization rectification unit configured to rectify an output signal of said third calculating member;

a voltage controlled oscillator configured to receive an output of said synchronization rectification unit, and to generate pulses having a frequency;

a counter configured to count the pulses generated by said voltage controlled oscillator, and to generate said corresponding digital output signal; and a calibration phase calculating unit configured to calculate a calibration phase of said resolver based on said reference pulse signal from said reference pulse generation unit and said digital output signal from said RDC.

2. The resolver phase calibration system of claim 1, wherein said reference pulse generation unit includes a comparator that compares said back electro-motive voltage signal with a reference voltage, and generates said reference pulse signal.

3. A resolver phase calibration method, comprising:

generating a reference pulse signal based on a back electro-motive voltage signal of a motor;

generating a digital output signal indicative of phase information of a resolver based on output signals of said resolver, wherein the generating a digital output signal further comprises, multiplying a sine wave signal output from said resolver by a cosine value of current position detection data to generate a first product;

multiplying a cosine wave signal output from said resolver by a sine value of said current position detection data to generate a second product;

subtracting said second product from said first product to generate a resultant output signal;

rectifying said resultant output signal to generate a rectified output signal;

generating pulses having a frequency related at least in part to said rectified output signal;

counting said generated pulses, and generating said corresponding digital output signal;

calculating a resolver phase calibration value based at least in part on said reference pulse signal and said digital output signal; and calibrating a phase offset of said resolver based on said phase calibration value.

4. A resolver phase calibration system, comprising:

a reference pulse generation unit configured to generate a reference pulse;

a resolver-to-digital converter (RDC) configured to convert output signals of a resolver to a digital output representing a phase difference related to said resolver position wherein said RDC comprises a first calculating member configured to multiply a sine wave signal output from said resolver by a cosine value of current position detection data;

a second calculating member configured to multiply a cosine wave signal output from said resolver by a sine value of said current position detection data;

a third calculating member configured to subtract an output signal of said second calculating member from an output signal of said first calculating member;

a synchronization rectification unit configured to rectify an output signal of said third calculating member;

a voltage controlled oscillator configured to receive an output of said synchronization rectification unit, and to generate pulses having a frequency;

a counter configured to count the pulses generated by said voltage controlled oscillator, and to generate said digital output; and a calibration phase calculating unit configured to calculate a calibration phase of said resolver based at least in part on said reference pulse signal from said reference pulse generation unit and said digital output signal from said RDC.

* * * * *